(12) United States Patent
Murnauer

(10) Patent No.: US 8,476,916 B2
(45) Date of Patent: Jul. 2, 2013

(54) PLUNGER WITH A QUICK LOCKING SYSTEM

(75) Inventor: Simon Murnauer, Tuntenhausen (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 535 days.

(21) Appl. No.: 12/743,792

(22) PCT Filed: Apr. 9, 2009

(86) PCT No.: PCT/EP2009/002658
§ 371 (c)(1),
(2), (4) Date: May 19, 2010

(87) PCT Pub. No.: WO2009/129935
PCT Pub. Date: Oct. 29, 2009

(65) Prior Publication Data
US 2010/0254789 A1 Oct. 7, 2010

(30) Foreign Application Priority Data
Apr. 24, 2008 (DE) .......................... 10 2008 020 585

(51) Int. Cl.
*G01R 31/26* (2006.01)
*B65G 1/133* (2006.01)
*B66H 19/00* (2006.01)
*B65H 29/24* (2006.01)

(52) U.S. Cl.
USPC .............. 324/750.2; 29/739; 29/740; 29/832; 414/737; 414/752.1; 901/40

(58) Field of Classification Search
USPC .................... 414/222.07, 416, 422, 788, 789, 414/729, 737, 752.1; 901/40; 324/158.1, 324/750.14, 750.2; 29/739–741, 832, 840; 606/205

See application file for complete search history.

(56) References Cited

U.S. PATENT DOCUMENTS

| | | | |
|---|---|---|---|
| 4,915,565 A | * | 4/1990 | Bond et al. ...................... 29/740 |
| 5,523,678 A | * | 6/1996 | Mitsui ...................... 324/750.25 |
| 6,568,654 B1 | * | 5/2003 | Michna et al. ................ 251/100 |

(Continued)

FOREIGN PATENT DOCUMENTS

| | | |
|---|---|---|
| CN | 101003125 A | 7/2007 |
| JP | 63-64897 | 6/1988 |

(Continued)

OTHER PUBLICATIONS

English Translation of Japanese Office action dated Mar. 15, 2012 for Japanese Patent Application No. 2010-535410, date of mailing Mar. 21, 2012, 5 pages.

(Continued)

*Primary Examiner* — Scott Lowe
(74) *Attorney, Agent, or Firm* — Christie, Parker & Hale, LLP

(57) ABSTRACT

The invention relates to a plunger that is used to feed and withdraw an electronic component, in particular integrated circuits, to and/or from a contact device that is connected to a test device. The plunger head can be secured to a base body by a quick locking system. The quick locking system can be placed in a rear-engagement position when the plunger head is rotated in relation to the base body, a position in which the plunger head is axially coupled to the base body.

8 Claims, 5 Drawing Sheets

U.S. PATENT DOCUMENTS

| | | | |
|---|---|---|---|
| 7,547,156 B2 * | 6/2009 | Kienzler | 403/322.1 |
| 7,588,484 B2 | 9/2009 | Momosaki | |
| 7,824,424 B2 * | 11/2010 | Jensen et al. | 606/205 |
| 8,232,815 B2 * | 7/2012 | Schaule et al. | 324/750.03 |
| 2003/0090258 A1 * | 5/2003 | Miao et al. | 324/158.1 |
| 2010/0196125 A1 * | 8/2010 | Jeserer et al. | 414/222.01 |

FOREIGN PATENT DOCUMENTS

| | | |
|---|---|---|
| JP | 03-137579 | 6/1991 |
| JP | 04-246302 | 9/1992 |
| JP | 07-181221 | 7/1995 |
| JP | 07-239362 | 9/1995 |

OTHER PUBLICATIONS

International Search Report, dated Oct. 22, 2009, corresponding to PCT/EP2009/002658, 6 pages.

English translation of Chinese Office action for CN Application No. 200980101186.7; Date of Notification Sep. 26, 2012; 8 pages.

* cited by examiner

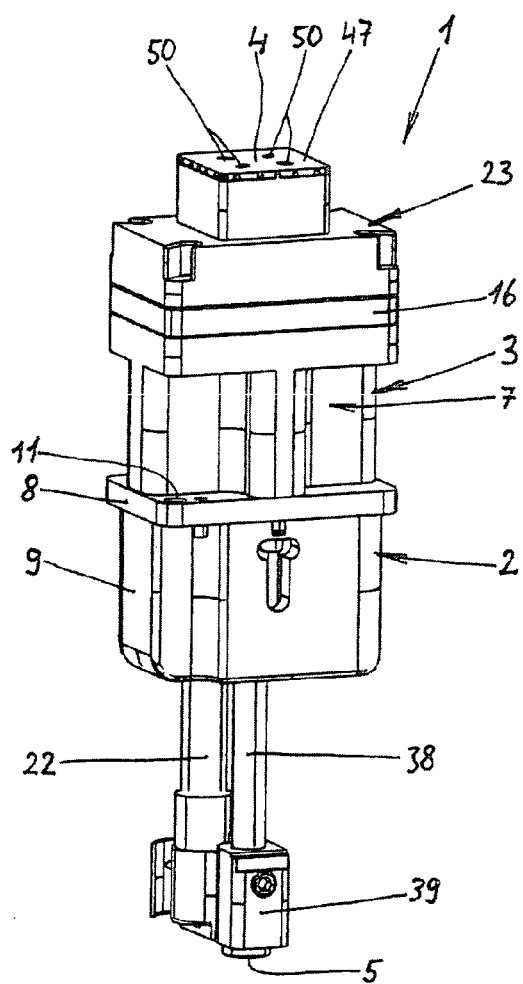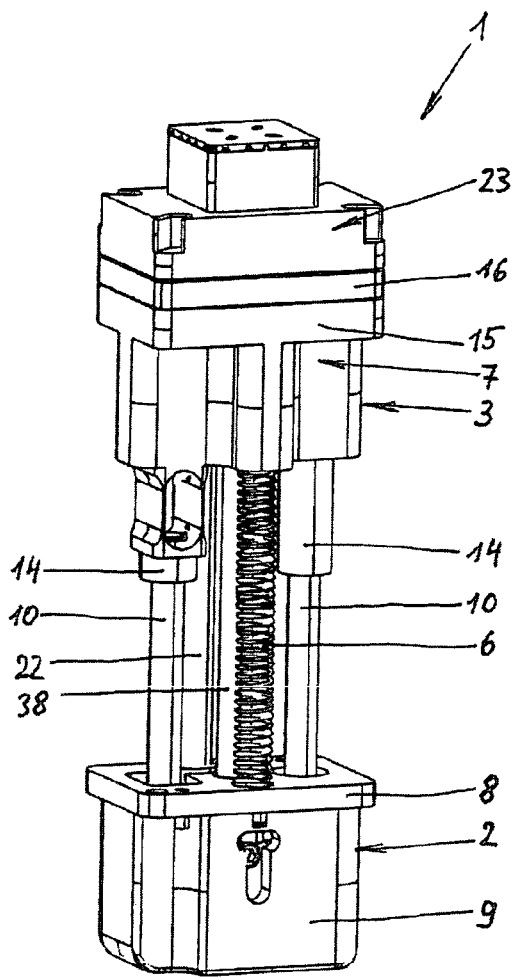
Fig. 1
Fig. 2

PLUNGER WITH A QUICK LOCKING SYSTEM

CROSS-REFERENCE TO RELATED APPLICATIONS

This application is a National Phase Patent Application of International Patent Application Number PCT/EP2009/002658, filed on Apr. 9, 2009, which claims priority of German Patent Application Number 10 2008 020 585.0, filed on Apr. 24, 2008.

BACKGROUND OF THE INVENTION

The invention relates to a plunger for feeding and withdrawing an electronic component, in particular ICs, to and/or from a contact device that is connected to a test device, comprising a plunger retaining part and a plunger sliding part.

Electronic components such as, for example, integrated circuits (semiconductor components with integrated circuits) are usually checked for their functionality before they are mounted, for example, on printed circuit boards or used in some other way. The components to be tested are usually brought in contact with contact devices by an automatic handling machine usually designated as a "handler", these contact devices being embodied in particular as contact sockets and being in electrical contact with a test head of a test device. After the end of the testing process, the components are removed from the contact devices again by the handler and are sorted depending on the test result.

For retaining and contacting the components, handlers usually have plungers, i.e. longitudinally displaceable retaining units which can be reciprocated in the manner of a piston, which can hold the components in particular by applying a suction force by negative pressure (vacuum). After placing the components on the plunger head, the plungers are brought into a position inside the handler in which they can be advanced on a rectilinear path further towards the contact devices until the components come in contact with the contact devices. After carrying out the test processes, the components are removed from the test head again by the plunger and positioned in such a manner that they can be removed from the handler via an unloading station and can be sorted depending on the test result.

The plunger head on which the component to be tested is held by suction force is usually detachably secured to the base body of the plunger sliding part by screws. As a result, when changing the component type, it is possible merely to replace the plunger head by another plunger head adapted to the new type of component whilst the remaining part of the plunger can remain unchanged. However, exchanging the plunger head is associated with a considerable amount of work and frequently cannot be accomplished in the desired simple manner.

SUMMARY OF THE INVENTION

It is therefore the object of the invention to provide a plunger of the type specified initially in which plunger heads can be exchanged in a particularly fast and simple manner.

In the plunger according to the invention, the plunger head can be secured on the base body by means of a quick locking system which comprises a first locking means disposed on said base body and a second locking means disposed on the plunger head, wherein the two locking means are configured in such a manner that they can be brought into a mutually rear-engagement position by rotating the plunger head relative to the base body, in which position the plunger head is axially coupled to the base body.

In the plunger according to the invention, the plunger heads can be secured in a very simple and quick manner on the base body of the plunger sliding part by placing the plunger head axially on the base body in a specific angle-of-rotation position and then turning by a specific angular amount, thus effecting an axial locking. The plunger head is released from the base body by turning the plunger head in the reverse direction and axially withdrawing from the base body. This can be accomplished in a completely tool-free manner.

According to a particularly advantageous embodiment, the locking means disposed on the base body comprises a ball part protruding in the direction of the plunger head which has at least two axial grooves distributed over its circumference and interposed spherical surface sections. The locking means disposed on the plunger head has clip elements which are movable along the axial grooves and which is brought into a position where they engage the spherical surface sections from the rear by rotating the plunger head. Such an embodiment of the quick locking system not only makes it possible to change the plunger heads particularly simply and quickly, which can be carried out by one hand inside the handler, but also when placing the component onto the connecting contacts of the contact device, the component together with the plunger head can move in all spatial directions so that the component can optimally adapt to the position of the contact device. Expediently in this case, a centering device for centering the plunger head relative to the contact device is provided on the plunger head. Such a centering device can, for example, consist of centering holes or centering recesses on the plunger head into which centering pins are inserted, these pins protruding from the contact devices (contact sockets). The centering of the plunger head and therefore of the component relative to the contact device is thereby not impeded by a rigid guidance of the plunger sliding part and there are no tensions in the plunger.

According to an advantageous embodiment, the ball part contains a negative pressure line which is connected on the one hand to a negative pressure supply line of the base body and on the other hand to at least one negative pressure channel of the plunger head. By this the vacuum required for holding the component can be fed to the contact surface of the plunger head in a simple and space-saving manner.

According to a particularly advantageous embodiment, the base body comprises a base part and a coupling plate which are held floatingly on the base part transversely to the axial direction of the plunger, wherein the first locking means is secured on the coupling plate and the plunger head is couplable to the coupling plate by the quick locking system. The floatingly held coupling plate makes it possible to move the plunger head also laterally, i.e. transversely to the longitudinal axis of the plunger to a certain extent, when the component is placed on the contact device. The centering of the component relative to the contact device can therefore be achieved in a particularly smooth-running and stress-free manner.

BRIEF DESCRIPTION OF THE DRAWINGS

The invention in explained in detail hereinafter with reference to the drawings as an example. In the figures;

FIG. 1 is a perspective view of the plunger according to the invention with withdrawn plunger sliding part;

FIG. 2 is a perspective view of the plunger from FIG. 1 with advanced plunger sliding part;

DETAILED DESCRIPTION OF THE DRAWINGS

Figure 3:
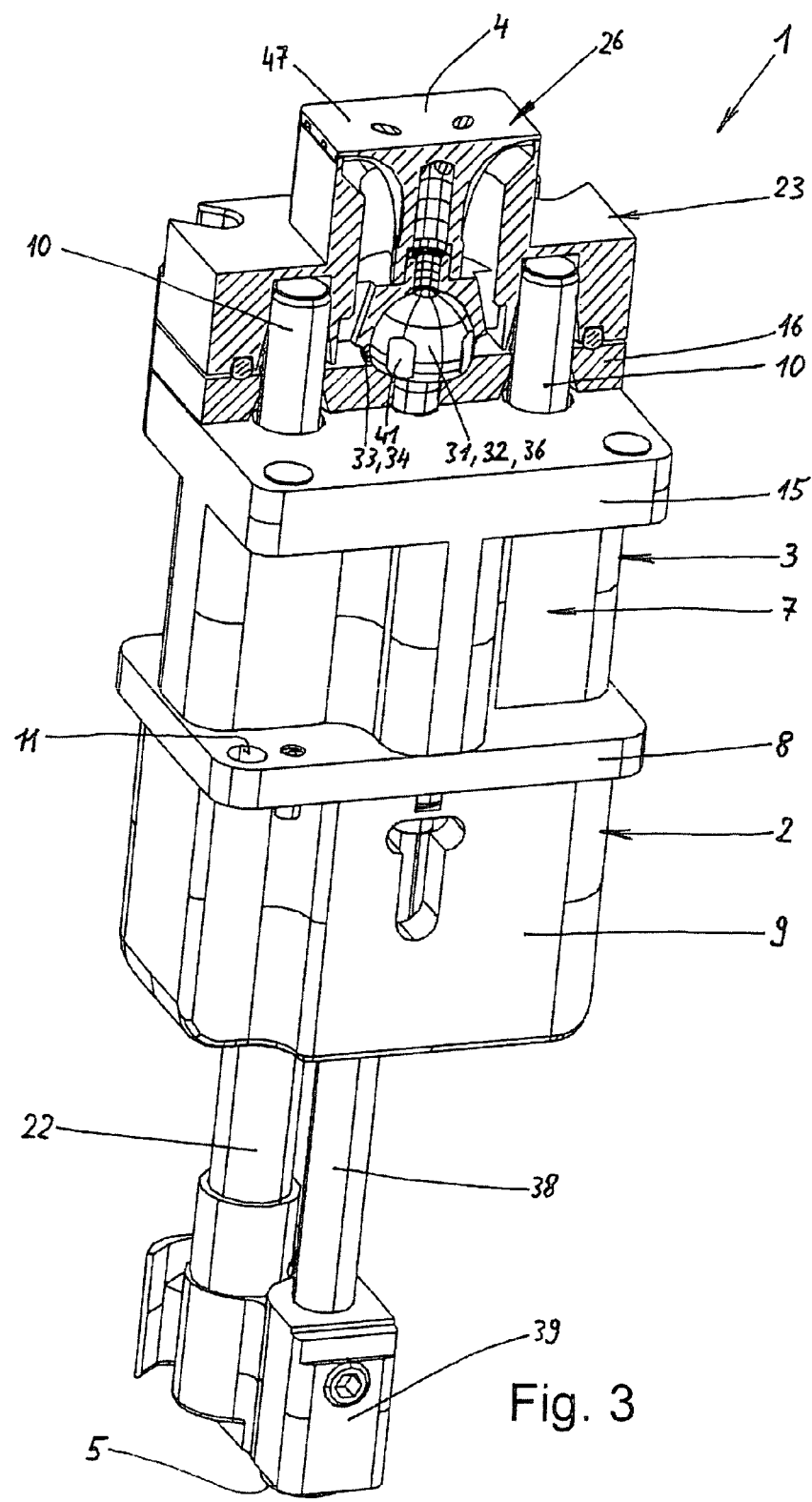
FIG. 3 is a perspective view according to FIG. 1 wherein the plunger is shown in cutaway view in the region of the plunger head and the coupling plate.

The plunger 1 shown in FIGS. 1 to 4 substantially comprises a plunger retaining part 2 and a plunger sliding part 3 which is held longitudinally displaceably on the plunger retaining part 2.

By the plunger retaining part 2, the plunger 1 can be secured inside a handler on a pivoting device, not shown or on a circulating carriage. An electronic component, not shown, that is placed on an anterior contact surface 4 of the plunger sliding part 3 and is held there by negative pressure (vacuum) can thus be brought into a position in which the plunger sliding part 3 can be advanced rectilinearly into a contact position in which connecting legs or connecting contacts of the component are placed on corresponding connecting contacts of a contact socket, not shown. The forward movement is effected in this case by a feed device, not shown, which presses onto a posterior face 5 of the plunger sliding part 3 and pushes this forwards relative to the plunger retaining part 2, as can be seen from FIGS. 2 and 4. The plunger 1 is returned into its initial position shown in FIGS. 1 and 3 by a retaining spring 6 in the form of a pull spring which is secured with its rear end on the plunger retaining part 2 and with its front end on a base body 7 of the plunger sliding part 3.

The plunger retaining part 2 comprises a retaining plate 8, a retaining body 9 and two centering pins 10. The retaining plate 8 projects laterally in a flange-like manner over the retaining body 9 and in two diagonally opposed corner regions has holes 11 for receiving screws, not shown, by which the retaining plate 8 can be screwed firmly to the not shown pivoting device or a circulating carriage.

Figure 4:
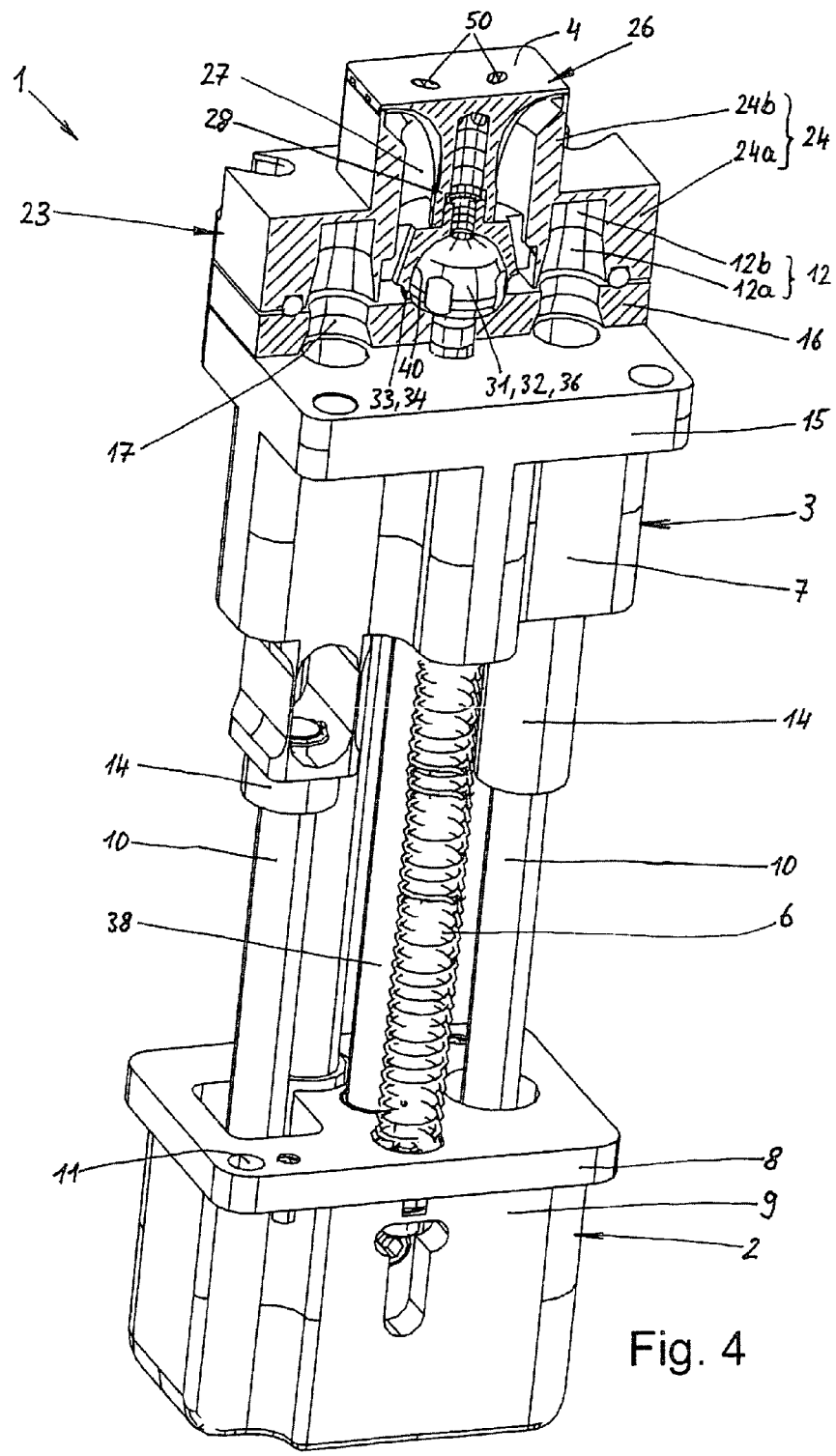
FIG. 4 is a perspective view according to FIG. 2 wherein the plunger is shown in cutaway view in the region of the plunger head and the coupling plate.

The retaining body 9 is disposed on the rear side of the retaining plate 8 and is formed integrally thereon. The two centering pins 10 are disposed parallel to one another and are secured at their rear end in the region of the rear end wall of the retaining body 9. Furthermore, the centering pins 10 protrude forwards by an appreciable amount beyond the retaining plate 8. The length of the centering pins is dimensioned so that in the withdrawn state of the plunger sliding part 3, as can be seen from FIG. 3, they extend through the entire base body 7 into the centering holes 12 of a plunger head 23 secured detachably to the base body 7. In the advanced state of the plunger sliding part 3 which is shown in FIGS. 3 and 4, the centering pins 10 come out of engagement with the centering holes 12 so that the plunger head 23 can turn relative to the base body 7 and can be tilted slightly in all directions, as will be described subsequently in further detail. In this advanced state of the plunger sliding part 3, however, the centering pins 10 are still in engagement with guide sleeves 14, disposed at the rear end of the base body 7. In the withdrawn state of the plunger sliding part 3 the guide sleeves 14 are located inside the plunger retaining part 2 so that they are not visible in FIGS. 1 and 3.

The base body 7 consists of a rear base part 15 having the guide sleeves formed on the rear-side end thereof, and a front intermediate or coupling plate 16 which is held laterally floatingly on the base part 15. As a result of this floating hold, the coupling plate 16 can be moved relative to the base part 15 to a certain extent in a plane lying perpendicular to the longitudinal direction of the plunger 1. As can be seen from FIG. 8, this is achieved by holes 17 in the coupling plate 16, through which the centering pins 10 project in the withdrawn state of the plunger sliding part 3, having a diameter which is a certain amount larger than the outside diameter of the centering pins 10. The centering pins 10 therefore have lateral play inside the holes 17.

Figure 8:
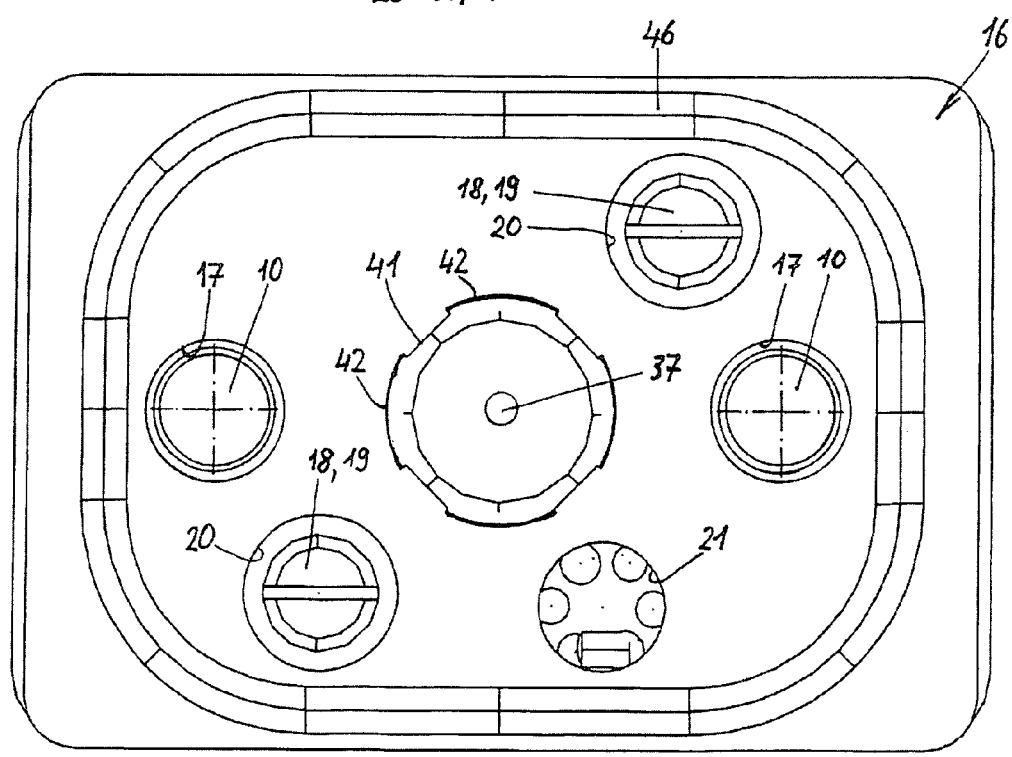
FIG. 8 is a plan view of the plunger without plunger head, i.e. of the coupling plate.

The axial fixing of the coupling plate 16 on the base part 15 is effected by two screws 18, of which only the screw heads 19 are visible in FIG. 8. The screw stems of the screws 18 pass through the holes in the coupling plate 16 which in turn have a larger diameter than the outside diameter of the screw stems. In addition, the screw heads 19 lie in countersunk holes 20 whose diameter is larger than the outside diameter of the screw heads 19. The screw heads 19 which overlap the coupling plate 16 in the region of the countersunk holes 20 hold the coupling plate 16 with slight axial play but laterally movably on the coupling plate 16.

As is apparent from FIG. 8, the coupling plate 16 furthermore has an axial hole 21 in order to be able to pass a temperature-controlled fluid, in particular a temperature-controlled gas, through the coupling plate 16. Such a temperature-controlled fluid is used for cooling or heating the components adhered to the plunger 1 if the components are to be tested under specific temperature conditions. To this end, the axial hole 21 is aligned with another axial hole of the base part 15, not shown in detail, which is connected to a fluid supply line 22 (FIGS. 1 to 4) of the plunger sliding part 3. The fluid supply line 22 passes through a corresponding recess in the plunger retaining part 2 and in the withdrawn position of the plunger sliding part 3, extends rearwards beyond the plunger retaining part.

The plunger 1 furthermore comprises a plunger head 23 which is securable on the coupling plate 16 by a special quick locking system described subsequently in more detail. The plunger head 23 substantially comprises a socket 24, a head central part 25 and a temperature-control body 26. The head central part 25 is firmly connected to the socket 24 or is formed in one piece therewith.

The socket 24 consists of a rear rectangular socket section 24a and a front socket section 24b having reduced diameter. A central axially continuous recess 27 in the socket 24 is dimensioned so that in the rear end region of the socket 24 the head central part 25 and from the front, a sleeve-shaped shaft section 28 of the temperature-control body 26 can be inserted.

In the rear socket section 24a, the two centering holes 12 are provided in the form of blind holes which are aligned with the holes 17 in the coupling plate 16 in the ready-mounted state of the plunger head 23. The rear section 12a of the centering holes 12 expands conically rearwards to form an insertion slope for the centering pins 10. The diameter of the front section 12b of the centering holes 12 on the other hand is dimensioned so that the centering pins 10 can be received with only slight radial play when the plunger sliding part 3 is moved back into the outermost withdrawn end position. In the withdrawn end position the plunger head 23 is consequently centered by the centering pins 10 relative to the base body 7 and therefore also relative to the plunger retaining part 2. As a result of this "back centering", the plunger head 23 is again brought back into a defined starting position and at the same time, laterally locked so that the plunger head can no longer be unintentionally displaced laterally when the plunger is moved rapidly in its withdrawn position inside the handler. If, on the other hand, the plunger sliding part 3 is moved together with the sucked-on component forwards in the direction of the contact socket, the centering pins 10 come out of engagement with the centering holes 29 so that the plunger head 23 together with the coupling plate 16 can be moved laterally to a certain extent and can be tilted somewhat in all directions relative to the coupling plate 16, as will be described subsequently in greater detail. The removal of the rigid coupling between plunger head 23 and the base body 7 allows the plunger head 23 to be centered in a tension-free manner by other centering means disposed in the region of this contact device before it reaches the contact device, e.g. a contact socket, disposed on the sides of the test apparatus. To this end, in the corner regions the rear socket section 24*a* has centering recesses 30 which engage with the centering pins, not shown, disposed in the region of the contact device, when the component is placed on the contact device.

In order to fix the plunger head 23 on the coupling plate 16, a first locking means 31 in the form of a ball part 32 is secured to the coupling plate 16, which locking means cooperates with a second locking means in the form of four clip elements 34 disposed on the head central part 25.

The ball part 32 is secured centrally on the coupling plate 16 and comprises a shaft section 35 which can be screwed into a central tapped hole in the coupling plate 16 and a ball head 36 which projects towards the front over the coupling plate 16. The ball part 32 is provided with a central continuous negative pressure line 37 which is connected at its rear end to a negative pressure supply line 38 of the plunger sliding part 3 which is configured as a negative pressure tube (FIG. 3). The negative pressure tube 38 is secured to the base body 7 and extends between the centering pins 10 and parallel thereto through the plunger retaining part 2 rearwards as far as a plunger supply part 39. This plunger supply part 39 comprises a connection, not shown in detail, for connecting the negative pressure tube 38 to a negative pressure generating device. Furthermore, the fluid supply line 22 also ends in the plunger supply part 39 so that fluid can be introduced into the fluid supply line 22 via the plunger supply part 39. If the fluid is intended to be heated, a heating device, for example, in the form of an electrical resistance heater wound in a spiral, can be located in the fluid supply line 22.

The negative pressure tube 38 which is guided in a guide hole in the retaining plate 8 serves, along with the two centering pins 10, as a further guide element for guiding the plunger sliding part 3 on the plunger retaining part 2.

The shaft section 35 of the ball part 32 is further movably connected to the negative pressure tube 38 so that the ball part 32 can move laterally together with the coupling plate 16 relative to the base part 15.

A spherical cap 40 which is part of the head central part 25 can be placed on the ball head 36. FIG. 7 shows a state in which the spherical cap 40 rests on the ball head 36. As can be seen from FIGS. 5 to 7, the clip elements 34 consist of finger-like protrusions which protrude rearwards over the spherical cap 40, the inner surfaces of the clip elements 34 continuously continuing the curvature of the spherical cap 40 as far as its free end, as can be seen from the sectional view from FIG. 7. In this case, the clip elements 34 extend so far around the ball head 36 that the clearance between two opposing clip elements 34 in the region of their free ends is smaller than that in their transition regions to the spherical cap 40. By this, in the position shown in FIGS. 6 and 7, the plunger head 23 can no longer be raised axially from the ball head 36. On the other hand, a ball head holder is created by this which fundamentally allows the plunger head 23 to pivot or tilt in all directions and turn about the longitudinal axis of the plunger 1.

Figure 5:
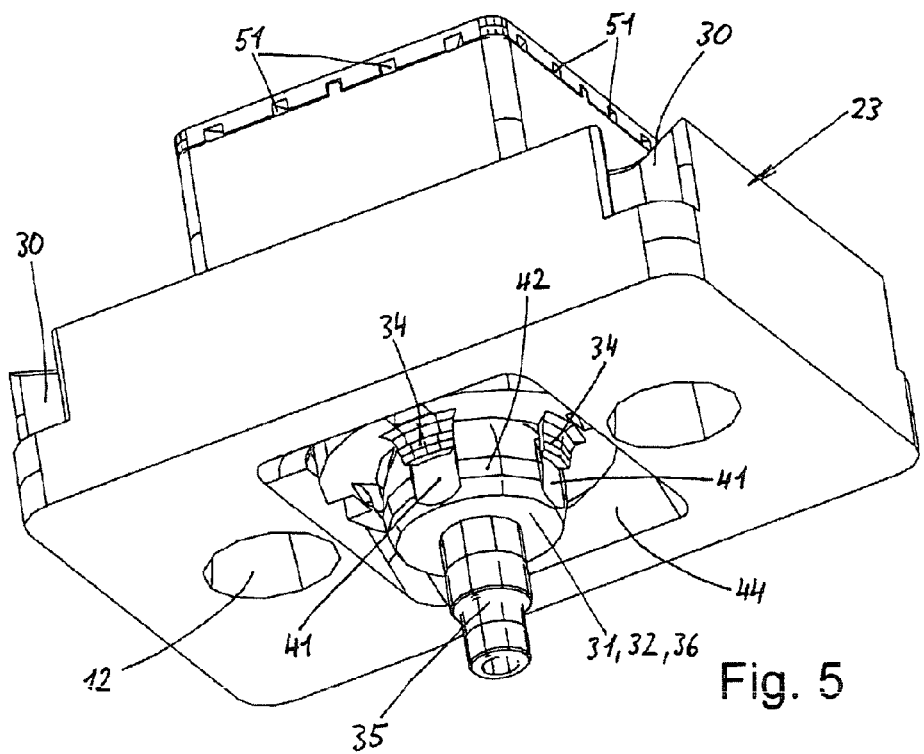
FIG. 5 is a perspective view of the plunger head and the first, spherical locking means in a position in which the plunger head is axially displaceable relative to the first locking means.
Figure 6:
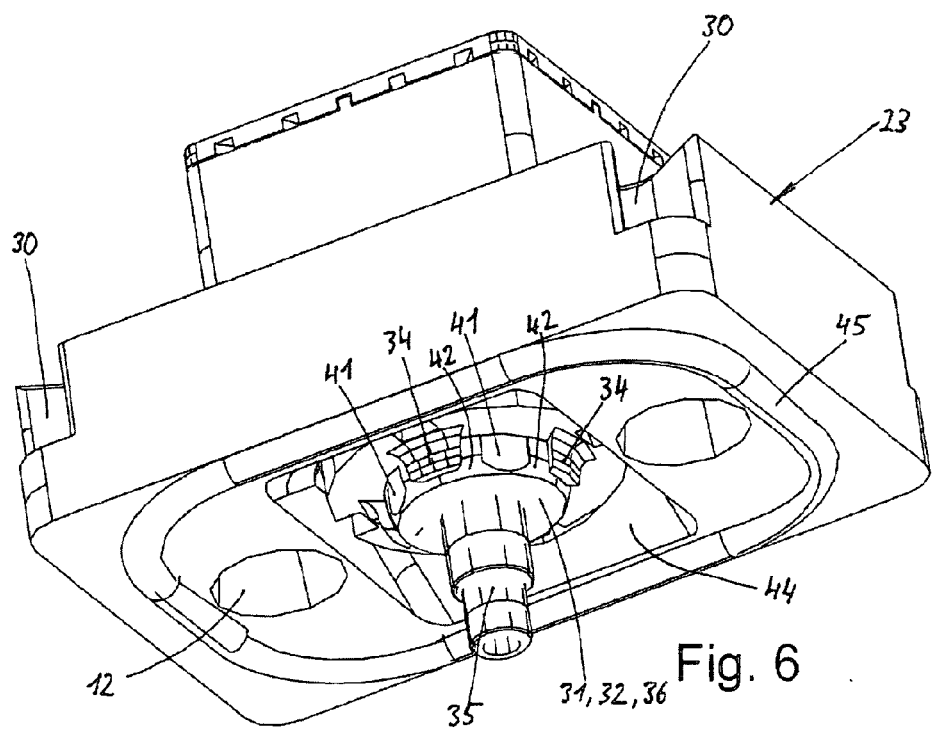
FIG. 6 is a perspective view of the plunger head and the first locking means in a position in which the plunger head is axially locked relative to the first locking means.
Figure 7:
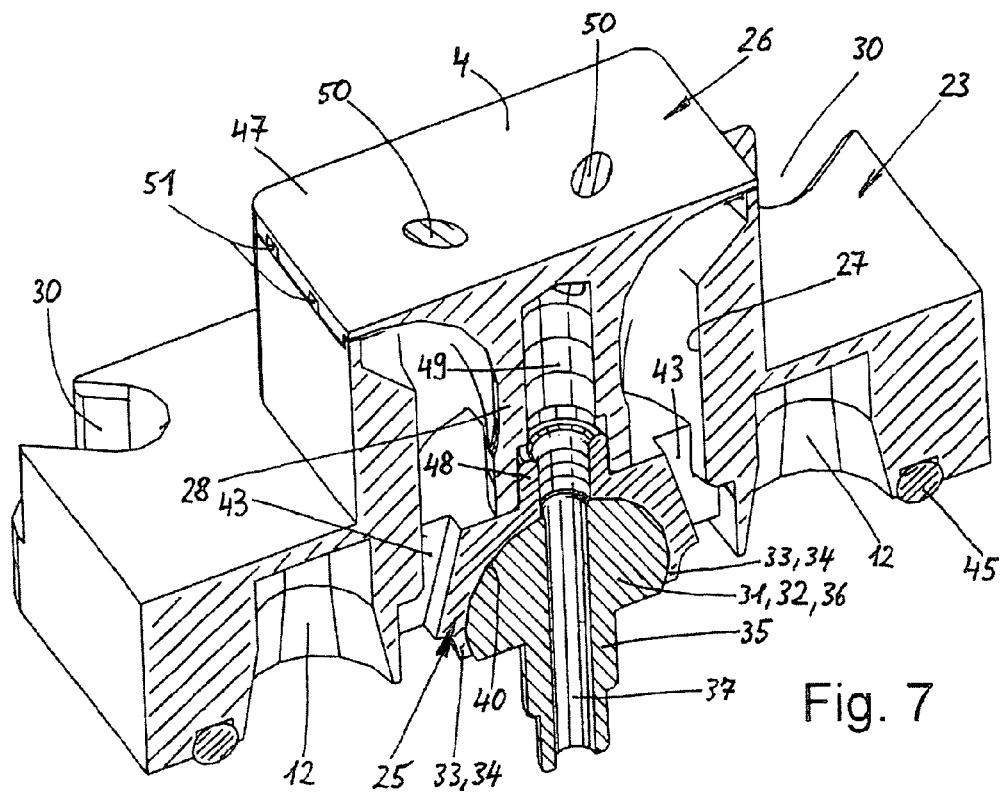
FIG. 7 is a sectional view through the plunger head and the first locking means from FIG. 6.

In order that the plunger head 23 can be brought into the locking position shown in FIGS. 6 and 7, the ball head 36 has four axial grooves or flattened sections 41 distributed regularly over its circumference which can be seen in particular from FIGS. 5 and 6. The distance between two opposite axial grooves 41 is in this case slightly smaller than the smallest distance between two opposite clip elements 34. In this way it is possible for the clip elements 34 to be displaced along the axial grooves 41 when the clip elements 34 are located in the region of the axial grooves 41. This situation is shown in FIG. 5. In this case, the plunger head 23 is located in a turning position relative to the coupling plate 16 which does not correspond to the operating position. At the rear end of the axial grooves 41 on the other hand, the spherical surface of the ball head 36 curves so far inwards that the plunger head 23 together with the clip elements 34 can turn relative to the coupling plate 16, whereby the clip elements 34 enter into the region of the interposed spherical surface sections 42 from the region of the axial grooves 41 and engage the ball head 36. In this position, which is shown in FIG. 6 the plunger head 23 is locked axially with the ball head 36.

As can be seen from FIG. 7, the head central part 25 furthermore has fluid channels 43 distributed regularly over its outer circumference. Temperature-controlled fluid supplied via the fluid supply line 22 and the axial hole 21 in the coupling plate 16, is fed through these fluid channels 43 from the rear socket section 24*a* to the front socket section 24*b* in order to impinge upon the temperature-control body 26 there and accordingly control its temperature. On its rear face the socket 24 has a pocket-like recess 44 (FIGS. 5, 6) into which the fluid channels 43 discharge, so that the fluid emerging from the axial hole 21 in the coupling plate 16 is distributed uniformly to all the fluid channels 43 of the head central part 25.

A peripheral seal 45 in the form of an O-ring which is embedded in a corresponding peripheral groove of the plunger head 23 is provided for fluid-tight sealing between the plunger head 23 and the coupling plate 16. This seal 45 completely encloses the centering holes 12 and the pocket-like recess 44 of the socket 24. Also provided on the front side of the coupling plate 16, as can be seen from FIG. 8, is a peripheral groove 46 in which the seal 45 comes to rest when the plunger head 23 is placed on the coupling plate 16. The seal 45 is configured to be so soft that it allows the plunger head 23 to tilt around the ball head 36 to a certain extent.

The temperature-control body 26 is configured to be substantially T-shaped in cross-section, as can be seen from FIG. 7 and consists of the shaft section 28 extending in the axial direction and a contact plate 47 disposed transversely to the axial direction, on which the component to be tested is placed and held by negative pressure. The temperature-control body 26, which appropriately consists of a highly heat-conductive material in particular metal such as aluminum, therefore serves not only for controlling the temperature of the components but is at the same time a part of the negative pressure system by which negative pressure is provided at the contact surface 4. To this end, the shaft section 28 of the temperature-control body 26 is connected to a front pipe connecting piece 48 of the head central part 25 and comprises a central channel 49 which is connected via the pipe connecting piece 48 to the negative pressure line 37 of the ball part 32. From the front end of the central channel 49 a plurality of negative pressure channels 50 extend to the contact surface 4, which channels discharge into the contact surface 4 at different locations. By this the component is adhered at different locations which ensures a very secure hold of the component on the plunger head 23.

The contact surface 4 of the temperature-control body 26 is flat and dimensioned so that the body of the components to be tested can rest thereon over its full area.

The outside diameter of the shaft section 28 of the temperature-control body 26 is expediently substantially smaller than the clear width of the axial recess 27 of the plunger head 23 so that the temperature-controlled fluid can flow from all directions from the fluid channels 43 to the temperature-control body 26. In order to improve the temperature control of the temperature-control body 26, this can be provided with surface-enlarging fins disposed on the inflow side. The temperature-controlled fluid can flow laterally outwards from the axial recess 27 into the contact plate 47 via lateral recesses 51.

A plurality of variations are possible within the scope of the invention. For example, it is not absolutely essential that a floating coupling plate 16 is provided. The quick locking system could also be implemented directly between the plunger head 23 and the base part 15. Furthermore, it is not absolutely essential that the contact plate 47 of the temperature-control body 26 covers the front socket section 24b, as shown in the drawings. The temperature-control body 26 could on the contrary also be disposed completely inside the axial recess 27 of the socket 24. Moreover, in this case it would also be possible to arrange the contact surface 4 for the component such that the walls of the front socket sections 24b serve as supports for connecting legs of the components. Although it is particularly advantageous to use four clip elements 34 as second locking means 33, it is easily possible to provide a different number of clip elements 34, but at least two clip elements 34, preferably between two and eight clip elements.

The invention claimed is:

1. A plunger for feeding and withdrawing an electronic component, in particular integrated circuits, to or from a contact device that is connected to a test device, comprising:
   a plunger retaining part; and
   a plunger sliding part that is displaceably guided on the plunger retaining part, and comprises a base body and a plunger head is securable to said base body for retaining a component by negative pressure,
   wherein the plunger head is securable on the base body by a quick locking system which comprises a first locking means disposed on said base body and a second locking means disposed on the plunger head, wherein the first locking means and the second locking means are configured to be brought into a rear-engagement position by rotating the plunger head relative to the base body, in which the plunger head is axially coupled to the base body; and
   wherein the first locking means disposed on the base body comprises a ball part protruding in a direction of the plunger head and has at least two axial grooves distributed over a circumference and interposed spherical surface sections and the second locking means disposed on the plunger head has clip elements which are moveable along the axial grooves and which are brought into a position where they engage the spherical surface sections from the rear by rotating the plunger head.

2. The plunger according to claim 1, wherein the plunger head has a head central part having a spherical cap adapted to the ball part of the base body, which spherical cap is placeable on the ball part.

3. The plunger according to claim 1, wherein the ball part contains a negative pressure line which is connected on the one hand to a negative pressure supply line of the base body to at least one negative pressure channel of the plunger head.

4. The plunger according to claim 3, wherein the plunger head comprises a socket having an anterior socket section and a highly heat-conductive temperature-control body which is insertable in the anterior socket section or placeable thereon, having a contact surface for the component, wherein at least one negative pressure channel runs through the temperature-control body and opens into the contact surface.

5. A plunger for feeding and withdrawing an electronic component, in particular integrated circuits, to or from a contact device that is connected to a test device, comprising:
   a plunger retaining part; and
   a plunger sliding part that is displaceably guided on the plunger retaining part, and comprises a base body and a plunger head is securable to said base body for retaining a component by negative pressure,
   wherein the plunger head is securable on the base body by a quick locking system which comprises a first locking means disposed on said base body and a second locking means disposed on the plunger head, wherein the first locking means and the second locking means are configured to be brought into a rear-engagement position by rotating the plunger head relative to the base body, in which the plunger head is axially coupled to the base body; and
   wherein the first locking means disposed on the base body comprises a ball part protruding in a direction of the plunger head and has at least two axial grooves distributed over a circumference and interposed spherical surface sections and the second locking means disposed on the plunger head has clip elements which are moveable along the axial grooves and which are brought into a position where they engage the spherical surface sections from the rear by rotating the plunger head;
   wherein the base body comprises a base part and a coupling plate which is held floatingly on the base part transversely to an axial direction of the plunger, wherein the first locking means is secured on the coupling plate and the plunger head is connected to the coupling plate by the quick locking system; and
   wherein the plunger head comprises at least one centering hole and at least one centering pin protruding in a direction of the plunger head and is secured to the plunger retaining part, wherein centering pin engages in an associated centering hole of the plunger head in a withdrawn position of the plunger sliding part and is out of centering engagement with the plunger head in an advanced position of the plunger sliding part.

6. The plunger according to claim 5, wherein the plunger head comprises a socket having an anterior socket section and a highly heat-conductive temperature-control body which is insertable in the anterior socket section or placeable thereon, having a contact surface for the component, wherein at least one negative pressure channel runs through the temperature-control body and opens into the contact surface.

7. The plunger according to claim 6, wherein a plurality of fluid channels are disposed around a spherical cap of a head central part, which fluid channels lead to the anterior socket section and feed temperature-controlled fluid to the temperature-control body.

8. The plunger according to claim 7, wherein the plunger head comprises a peripheral seal on a side facing the coupling plate, which seal extends around the fluid channels and abuts in a fluid-tight manner against the coupling plate.

* * * * *